(12) United States Patent
Song et al.

(10) Patent No.: US 7,598,671 B2
(45) Date of Patent: Oct. 6, 2009

(54) FLAT PANEL DISPLAY AND METHOD OF MANUFACTURING THE SAME

(75) Inventors: Young-Woo Song, Suwon-si (KR);
Yoon-Chang Kim, Suwon-si (KR);
Jong-Seok Oh, Suwon-si (KR);
Sang-Hwan Cho, Suwon-si (KR);
Ji-Hoon Ahn, Suwon-si (KR); Joon-Gu Lee, Suwon-si (KR); So-Young Lee, Suwon-si (KR); Jae-Heung Ha, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 375 days.

(21) Appl. No.: 11/485,796

(22) Filed: Jul. 12, 2006

(65) Prior Publication Data

US 2007/0013302 A1    Jan. 18, 2007

(30) Foreign Application Priority Data

Jul. 13, 2005    (KR)    ........................ 10-2005-0063272

(51) Int. Cl.
*H01J 1/62*    (2006.01)
(52) U.S. Cl. ..................................... 313/506; 313/498
(58) Field of Classification Search ................. 313/495, 313/498, 500–506, 509, 512
See application file for complete search history.

(56) References Cited

U.S. PATENT DOCUMENTS

| 6,791,261 B1 | 9/2004 | Shimoda et al. |
| 2005/0140277 A1 | 6/2005 | Suzuki et al. |

FOREIGN PATENT DOCUMENTS

| JP | 04-192290 | 7/1992 |
| JP | 06-275381 | 9/1994 |
| JP | 07-037688 | 2/1995 |
| JP | 08-008061 | 1/1996 |
| JP | 10-172756 | 6/1998 |
| JP | 2003-031374 | 1/2003 |
| JP | 2004-235152 | 8/2004 |
| JP | 2005-093399 | 4/2005 |
| JP | 2005-116516 | 4/2005 |
| JP | 2005-156871 | 6/2005 |
| KR | 10-2001-0093778 | 10/2001 |
| KR | 10-2005-0067067 | 6/2005 |

*Primary Examiner*—Vip Patel
(74) *Attorney, Agent, or Firm*—Knobbe Martens Olson & Bear LLP

(57) ABSTRACT

A flat panel display and a method of manufacturing the same are disclosed. In one embodiment, the flat panel display includes a substrate, a plurality of pixels formed on the substrate, and a light resonating layer formed on the subpixels. Each of the pixels includes subpixels that emit red light, green light, and blue light, respectively. The light resonating layer includes two or more layers and varies in thickness depending on the colors of the light emitted from the subpixels.

17 Claims, 4 Drawing Sheets

FLAT PANEL DISPLAY AND METHOD OF MANUFACTURING THE SAME

CROSS-REFERENCE TO RELATED PATENT APPLICATION

This application claims the benefit of Korean Patent Application No. 10-2005-0063272, filed on Jul. 13, 2005, in the Korean Intellectual Property Office, the disclosure of which is incorporated herein in its entirety by reference.

BACKGROUND OF THE INVENTION

1. Field of the Invention

The present invention relates to a flat panel display and a method of manufacturing the same, and more particularly, to a flat panel display that is easy to manufacture while providing improved brightness and external light coupling efficiency, and a method of manufacturing the same.

2. Description of the Related Technology

The external light coupling efficiency $\eta_{ex}$ of a flat panel display can be expressed as Equation 1 below.

$$\eta_{ex} = \eta_{in} \cdot \eta_{out} \quad \text{(Eq. 1)}$$

where $\eta_{in}$ and $\eta_{out}$ are an internal light coupling efficiency and an output coupling efficiency, respectively The internal light coupling efficiency $\eta_{in}$ is determined by self-destructive light in respective layers of the flat panel display, and the output coupling efficiency $\eta_{out}$ is determined by a total reflection between the respective layers. The total reflection is a phenomenon that light is totally reflected when it advances from a high refractive layer to a low refractive layer at angles above a critical incidence angle.

In the case of the flat panel display, light emitted from an emission layer passes through many layers until it is outputted to an outside of the display. Therefore, there may exist light that cannot be outputted to the outside due to the refractive index of each layer.

In Equation 1, when considering the total reflection between the respective layers, a light transmission efficiency $\eta_{out}$ of light emitted from the emission layer to the outside can be expressed as Equation 2 below.

$$\eta_{out} = (1/2)(N_{out}/N_{in})^2 \quad \text{(Eq. 2)}$$

where N is the refractive index of each layer

When light travels from a layer with a refractive index of about 1.5 to a layer with a refractive index of about 1.2, the light transmission efficiency can be calculated at 32% from Equation 2. That is, it can be seen that about 70% of light incident on the interface between the two layers is lost while traveling multiple layers.

Many attempts have been made to prevent the degradation of the external light coupling efficiency.

An example of the above attempts is to increase a supply voltage so as to improve the brightness. This method, however, requires a large capacity of battery and thus conflicts with lightweightness. The method also shortens the lifetime of the battery and pixels in a display. Therefore, there have been proposed the following prior arts for improving the brightness while reducing the supply voltage.

Japanese Patent Laid-open Publication No. HEI 4-192290 discloses an inorganic electroluminescence (EL) apparatus in which inorganic EL devices are formed in a transparent substrate and a plurality of condensing microlenses whose size is equal to or larger than the size of the inorganic EL device are formed on an outer surface of the transparent substrate. Light is incident on the interface between the transparent substrate and air at angles above a critical angle, and its incident angle is reduced below a critical angle in the microlens, thereby reducing the total reflection. Also, the light is outputted in a given direction, thereby improving the brightness in the given direction. However, since the EL device is a surface light source, it inevitably generates undesirable EL light that is diffused rather than condensed. Also, images from the neighboring EL devices overlap with each other, thereby degrading the image sharpness.

Japanese Patent Laid-open Publication No. HEI 7-037688 discloses an EL device that is formed in a substrate including a high refractive portion that is formed of a higher refractive material than its peripheral portion. Light emitted from the EL device is outputted through the high refractive portion, thereby improving the external light coupling efficiency. EL light having passed through the high refractive portion is diffused as illustrated in FIG. 1 of the Publication. Therefore, the front brightness cannot be improved greatly.

Japanese Patent Laid-open Publication No. HEI 10-172756 discloses an organic EL apparatus in which one or more condensing lenses are formed between a lower electrode constituting an organic EL device and an outer surface of a transparent substrate and the organic EL devices are provided corresponding to the condensing lens. Light, which was emitted from the organic EL and having passed through the condensing lens, is incident on the interface between the transparent substrate and air at angles below a critical angle, thereby improving the external light coupling efficiency. However, images from the neighboring EL devices overlap with each other, thereby degrading the image sharpness.

SUMMARY OF CERTAIN INVENTIVE ASPECTS

One aspect of the present invention provides a flat panel display that is easy to manufacture while providing improved brightness and external light coupling efficiency, and a method of manufacturing the same.

Another aspect of the present invention provides a flat panel display including: a substrate, a plurality of pixels formed on the substrate, each of the pixels including subpixels emitting red light, green light, and blue light, respectively and a light resonating layer formed on the subpixels, wherein the light resonating layer includes two or more layers and varies in thickness depending on the colors of the light emitted from the subpixels.

The light resonating layer may include one or more low refractive layers and one or more high refractive layers alternating with the low refractive layers.

The light resonating layer may include a first layer and a second layer.

The first layer may be nearer to the subpixel than the second layer and may be lower in refractive index than the second layer.

The thickness of the first layer may be $(n\lambda)/2$, where n is a positive integer and $\lambda$ is the wavelength of light emitted from the subpixel.

The thickness of the second layer may be $(2m+1)\lambda/4$, where m is a positive integer and $\lambda$ is the wavelength of light emitted from the subpixel.

The subpixel may include an organic light emitting device.

The light emitted from the subpixels may be emitted upward from the subpixels.

Another aspect of the present invention provides a method of manufacturing a flat panel display, the method including: preparing a substrate, forming a plurality of subpixels on the substrate and forming a light resonating layer including two or more layers on the subpixels, the light resonating layer varying in thickness depending on the subpixels.

The forming of the light resonating layer may include: forming a first layer on the subpixels, etching the first layer such that the first layer varies in thickness depending on the subpixels and forming a second layer covering the first layer.

Alternatively, the forming of the light resonating layer may include: forming a first layer on the subpixels, etching the first layer such that the first layer varies in thickness depending on the subpixels forming a second layer covering the first layer, and repeating the forming of the first layer, the etching of the first layer, and the forming of the second layer two or more times.

Another aspect of the invention provides a flat panel display, comprising: i) a substrate, ii) a plurality of pixels formed on the substrate, wherein each pixel includes a plurality of subpixels and each subpixel emits a different color of light and iii) a brightness control layer formed on the subpixels, wherein the brightness control layer includes first and second layers, and wherein at least one of the first and second layers varies in thickness depending on the wavelengths of light emitted from the respective subpixels so as to control the brightness of the emitted light.

Still another aspect of the invention provides a method of using a flat panel display, comprising: i) providing first and second electrodes, ii) providing a plurality of pixels between the electrodes, wherein each pixel includes a plurality of subpixels, iii) emitting different colors of light from the subpixels toward at least one of the first and second electrodes and iv) directing a substantial amount of the emitted light in a direction generally perpendicular to a surface of at least one of the first and second electrodes by the use of a plurality of layers formed on at least one of the two electrodes, wherein two adjacent layers have substantially different refractive indexes.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Embodiments of the present invention will now be described more fully with reference to the accompanying drawings, in which exemplary embodiments of the invention are shown. In the following description, it should be noted that when a layer is referred to as being "on" another layer or substrate, it can be directly on the other layer or substrate, or intervening layers may also be present.

Figure 1:
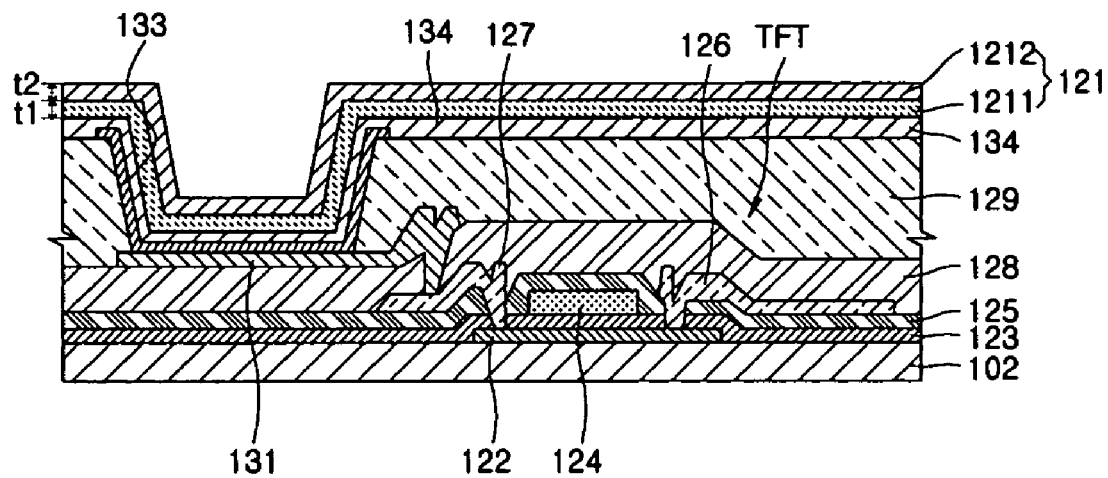
FIG. 1 is a schematic sectional view of a flat panel display according to an embodiment of the present invention.

FIG. 1 is a schematic sectional view of a flat panel display (for convenience, an organic light emitting display is illustrated) according to an embodiment of the present invention.

Referring to FIG. 1, the organic light emitting display includes a plurality of pixels formed on a substrate 102. Each of the pixels includes R/G/B subpixels that emit red light, green light, and blue light, respectively. The subpixel may include an EL device, and the EL device may include at least one thin film transistor (TFT).

Organic light emitting displays can be classified into a passive matrix (PM) organic light emitting display and an active matrix (AM) organic light emitting display depending on the type of a controlling method of emission in each pixel. For convenience, description will be provided based on an AM organic light emitting display.

The EL device includes a first electrode 131 formed above the substrate 102, a second electrode 134 formed above the first electrode 131 to face the first electrode 131, and an intermediate layer 133 formed between the first electrode 131 and the second electrode 134. The intermediate layer 133 includes an emission layer. In one embodiment, the first electrode 131 is provided with at least one TFT, and may be further provided with a capacitor, if necessary.

The substrate 102 may be formed of transparent glass or plastic material such as acryl, polyimide, polycarbonate, polyester, and mylar. A buffer layer (not illustrated) formed of $SiO_2$ may be formed on the substrate 102 so as to maintain the surface smoothness of the substrate 102 and prevent impurity penetration.

The first electrode 131 and the second electrode 134 may function as an anode and a cathode, respectively. Alternatively, the first electrode 131 and the second electrode 134 may function as a cathode and an anode, respectively.

In one embodiment, the organic light emitting display is a front emission type organic light emitting display that emits light toward the second electrode 134. Accordingly, the first electrode 131 and the second electrode 134 are a reflective electrode and a transparent electrode, respectively. Therefore, the first electrode 131 may be configured to include: a reflective layer formed using one selected from the group consisting of Ag, Mg, Al, Pt, Pd, Au, Ni, Nd, Ir, Cr, and a combination thereof; and a layer formed on the reflective layer using ITO, IZO, ZnO, or $In_2O_3$. The first electrode 131 may be provided corresponding to the subpixel. The second electrode 134 may be configured to include: i) a layer deposited on the intermediate layer 133 using at least one of the following: Li, Ca, LiF/Ca, LiF/Al, Al and Mg and ii) an auxiliary electrode (or a bus electrode line) formed on the deposited layer using a transparent electrode material such as ITO, IZO, ZnO, or $In_2O_3$. The second electrode 134 may be provided corresponding to entire pixels. In at least one embodiment, the first and second electrodes may be modified in various forms.

A TFT connected to the first electrode 131 includes a semiconductor layer 122, a gate insulating layer 123 formed on the semiconductor layer 122, and a gate electrode 124 formed on the gate insulating layer 123. The gate electrode 124 is connected to a gate line (not illustrated) for applying a TFT on/off signal. A region where the gate electrode 124 is formed corresponds to a channel region of the semiconductor layer 122. It is apparent that the TFT is not limited to the above structure but may be various TFTs such as an organic TFT.

An interlayer insulating layer 125 is formed on the gate electrode 124, and a source electrode 126 and a drain electrode 127 are formed to contact the source and drain regions of the semiconductor layer 122, respectively, through contact holes.

A planarization or passivation layer 128 is formed on the source and drain electrodes 126 and 127 using $SiO_2$, and a pixel defining layer 129 is formed on the planarization layer 128 using an insulating material such as acryl or polyimide.

Although not illustrated in FIG. 1, at least one capacitor may be connected to the TFT. It is apparent that a circuit including the above TFT is not limited to that illustrated in FIG. 1 but may be modified in various forms.

The drain electrode 127 is connected to an EL device. The first electrode 131 serving as the anode of the EL device is formed on the planarization layer 128, the pixel defining layer 129 is formed on the resulting structure, and the intermediate layer 133 including the emission layer is formed in an opening provided to the pixel defining layer 129. In FIG. 1, for convenience in describing the structure of each subpixel, the intermediate layer 133 is illustrated as being patterned corresponding only to the subpixel. However, it is apparent that the intermediate layer 133 may be formed in a body with an intermediate layer of the neighboring subpixel.

The intermediate layer 133 may be formed of organic material or inorganic material. The organic material of the intermediate layer 133 may be low-molecular organic material or high-molecular organic material. When the intermediate layer 133 is formed of low-molecular organic material, it may be formed in a single or multi stack structure including a hole injection layer (HIL), a hole transport layer (HTL), an emission layer (EML), an electron transport layer (ETL), and an electron injection layer (EIL). The low-molecular organic material may be copper phthalocyanine (CuPc), N,N'-Di (naphthalene-1-yl)-N,N'-diphenyl-benzidine (NPB), or tris-8-hydroxyquinoline aluminum (AlQ3). These low-molecular weight organic materials may be formed by vacuum deposition.

When the intermediate layer 133 is formed of high-molecular weight organic material, it may include an HTL and an EML. At this time, the HTL may be formed of Poly(3,4-ethylenedioxythiophene) poly(styrenesulfonate) (PEDOT), and the EML may be formed of poly-phenylenevinylene (PPV) or polyfluorene based high-molecular weight organic material.

It is apparent that the above structure and material of the intermediate layer 133 may be modified in various forms and can be equally applied to at least one of the following embodiments.

The EL device formed on the substrate 102 is sealed by an opposite member (not illustrated). Like the substrate 102, the opposite member may be formed of glass or plastic material. Alternatively, the opposite member may be formed of a metal cap.

A light resonating layer may be formed on the subpixels. In one embodiment where each subpixel includes the EL device, a light resonating layer 121 is formed on the second electrode 134 as illustrated in FIG. 1. It is apparent that additional layers may be further formed on the second electrode 134. In this case, it is apparent that the light resonating layer 121 may be formed anywhere between the additional layers. This may be equally applied to at least one of the following embodiments.

The light resonating layer 121 may include two or more layers 1211 and 1212, and its thickness may vary depending on the wavelength of light emitted from the emission layer. The light resonating layer 121 may include high refractive layers and low refractive layer alternating with the high refractive layer. Here, the high or low refractive index represents the relative refractive index of the layers included in the light resonating layer 121. This may be equally applied to at least one of the remaining embodiments. In one embodiment, the light resonating layer 121 includes a first layer (i.e., the layer 1211) and a second layer (i.e., the layer 1212).

In the above structure, the first layer 1211, which is closer to the subpixel (specifically, the second electrode 134) than the second layer 1212, is lower in refractive index than the second layer 1212. In this case, as the light emitted from the emission layer travels upward, it sequentially passes through the low refractive layer (the first layer 1211) and the high refractive layer (the second layer 1212). Consequently, horizontally-diffusing light can be focused on a center of the display (i.e., the front side of the organic light emitting display), thereby enhancing the brightness.

The path of light emitted from the emission layer will now be described in detail. Among the emitted light, some light (first light) passes through the first layer 1211 and the second layer 1212 without reflection. On the contrary, other light (second light) is reflected at the interface between the first layer 1211 (low refractive layer) and the second layer 1212 (high refractive layer), is again reflected at the interface between the first layer 1211 and a layer beneath the first layer 1211, and then passes through the first and second layers 1211 and 1212. This optical path difference doubles the thickness of the first layer 1211. Therefore, when the thickness of the first layer 1211 is t1, the optical path difference is 2t1. The second light has the same phase as the original. A constructive interference occurs when an optical path difference is the integral multiple of a wavelength. Therefore, when the thickness t1 of the first layer 1211 satisfies Equation 3 below, a constructive interference occurs to improve the brightness and the external light coupling efficiency.

$$t1=(n\lambda)/2 \quad (Eq. 3)$$

where n is an positive integer and λ is the wavelength of the light emitted from the subpixel Since the wavelengths of light emitted from the respective subpixel are different from each other, the brightness and the external light coupling efficiency can be improved by adjusting the thickness t1 to satisfy Equation 3 according to the wavelengths of the emitted light.

Meanwhile, among the light emitted from the emission layer, some light (third light) passes through the first layer 1211 and the second layer 1212 without reflection. On the contrary, other light (fourth light) is reflected at the upper surface of the second layer 1212, is again reflected at the lower surface of the first layer 1211, and then passes through the first and second layers 1211 and 1212. In this case, when thicknesses of the first and second layers 1211 and 1212 are t1 and t2, respectively, an optical path difference is 2(t1+t2). The fourth light changes in phase by 180° when it is reflected at the upper surface of the second layer 1212. A constructive interference occurs when an optical path difference is the odd multiple of a half wavelength. Therefore, when the optical path difference satisfies Equation 4 below, a constructive interference occurs to improve the brightness and the external light coupling efficiency.

$$2(t1+t2)=(2k+1)n\lambda/2 \quad (Eq. 4)$$

where k is an positive integer and λ is the wavelength of the light emitted from the subpixel Equation 5 below can be obtained by substituting the value of t1 from Equation 3 for t1 of Equation 4.

$$t2=(2m+1)\lambda/4 \qquad (Eq. 5)$$

where m is (k−n), that is, an positive integer

The brightness and the external light coupling efficiency can be improved by adjusting the thickness t2 to satisfy Equation 5. At this time, since the wavelengths of light emitted from the respective subpixel are different from each other, the thickness t2 of the second layer 1212 may be adjusted to satisfy Equation according to the wavelengths of the emitted light.

Since each layer of the EL device generally has a refractive index of about 1.5, the first layer 1211 (i.e., the low refractive layer of the light resonating layer 121) may be formed of a material with a refractive index smaller than 1.5. In one embodiment, because the first layer 1211 is dielectric, and because a material with refractive index smaller than about 1.0 is metal, the first layer 1211 is formed of a material with a refractive index greater than about 1.0. This low refractive material for the first layer 1211 may be at least one of the following: silicate matrix, methylsiloxanes polymer, siloxane, Ti—O—Si, acrylic polymer, epoxy polymer, an oxide (such as $SiO_2$, $HfO_x$, and $AL_2O_3$) and a fluoride (such as MgF and CaF). Since each layer of the EL device generally has a refractive index of about 1.5, the second layer 1212 (i.e., the high refractive layer of the light resonating layer 121) may be formed of a material with a refractive index larger than about 1.5. Further, a dielectric material with highest refractive index that is available in this case is a material with a refractive index of about 3.0. Thus, the second layer 1212 may be formed of a material with a refractive index and smaller than about 3.0. This high refractive material for the second layer 1212 may be a sol gel material in which high refractive particles (such as $SiN_x$, $TiO_2$, $Nb_2O_5$, or $Ta_2O_x$) are distributed.

At this time, the respective layers 1211 and 1212 of the light resonating layer 121 may be formed corresponding to each subpixel or pixel, or may be formed in a body with all the pixels. In one embodiment, the thicknesses of the first and second layers 1211 and 1212 vary depending on the wavelengths of light emitted from the respective subpixels, as described above.

Figure 2:
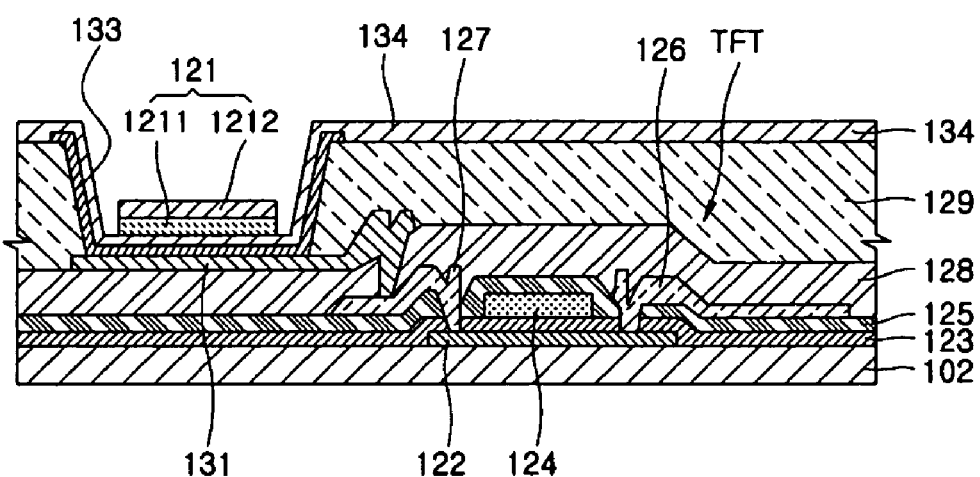
FIG. 2 is a schematic sectional view of an organic light emitting display according to another embodiment of the present invention.
Figure 3:
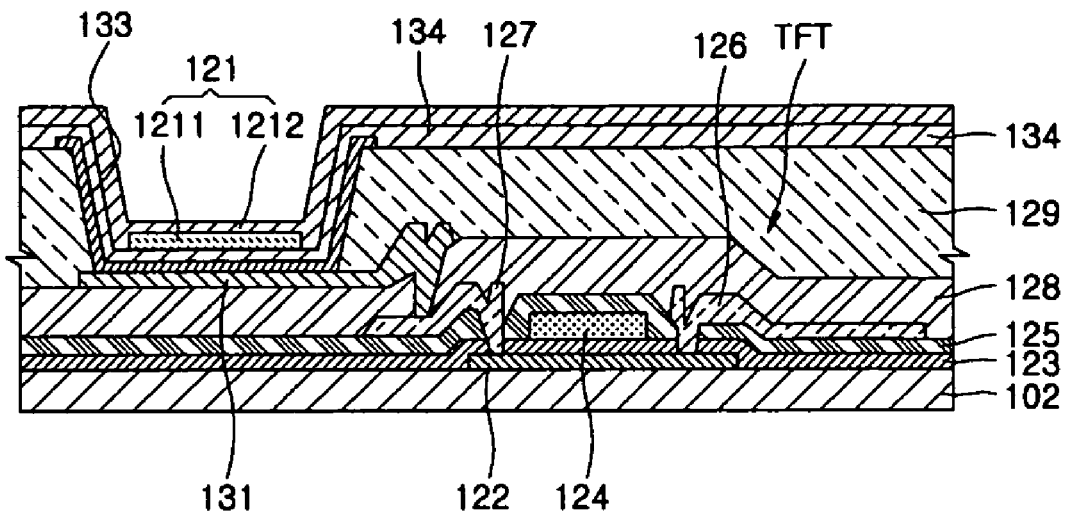
FIG. 3 is a schematic sectional view of an organic light emitting display according to a modified embodiment of the present invention.
Figure 4:
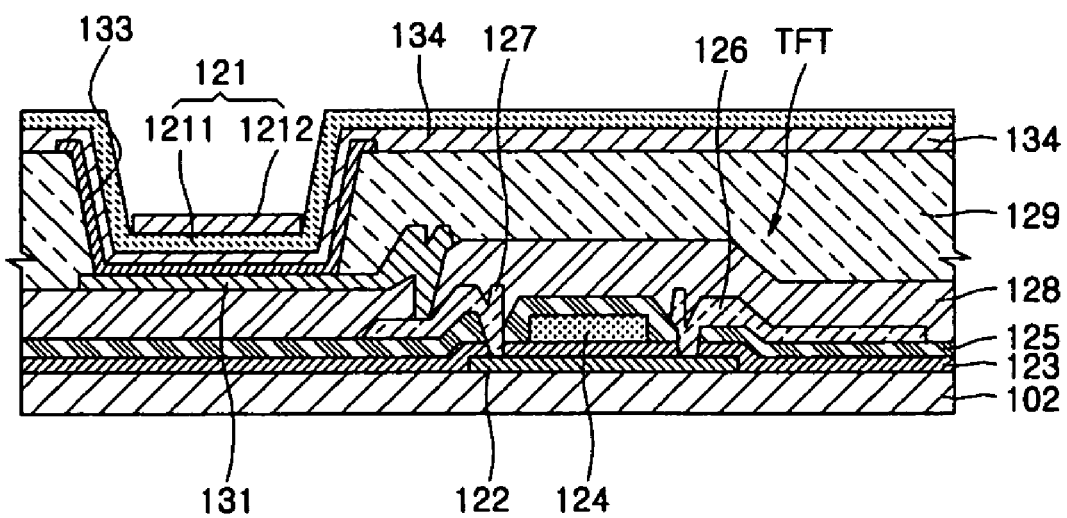
FIG. 4 is a schematic sectional view of an organic light emitting display according to another modified embodiment of the present invention.

As illustrated in FIG. 1, the first and second layers 1211 and 1212 of the light resonating layer 121 are formed over the entire surface of the substrate 102. It is apparent that the first and second layers may be modified in various structures, for example, as illustrated in FIGS. 2 through 4. Referring to FIG. 2, the first and second layers 1211 and 1212 are patterned corresponding to each subpixel. Referring to FIG. 3, the first layer 1211 is patterned corresponding to each subpixel, while the second layer 1212 is formed over the entire surface of the substrate 102. Referring to FIG. 4, the first layer 1211 is formed over the entire surface of the substrate 102, while the second layer 1212 is patterned corresponding to each subpixel. In these cases, the thicknesses of the respective layers may also be adjusted to satisfy Equations 3 and 5.

Figure 5:
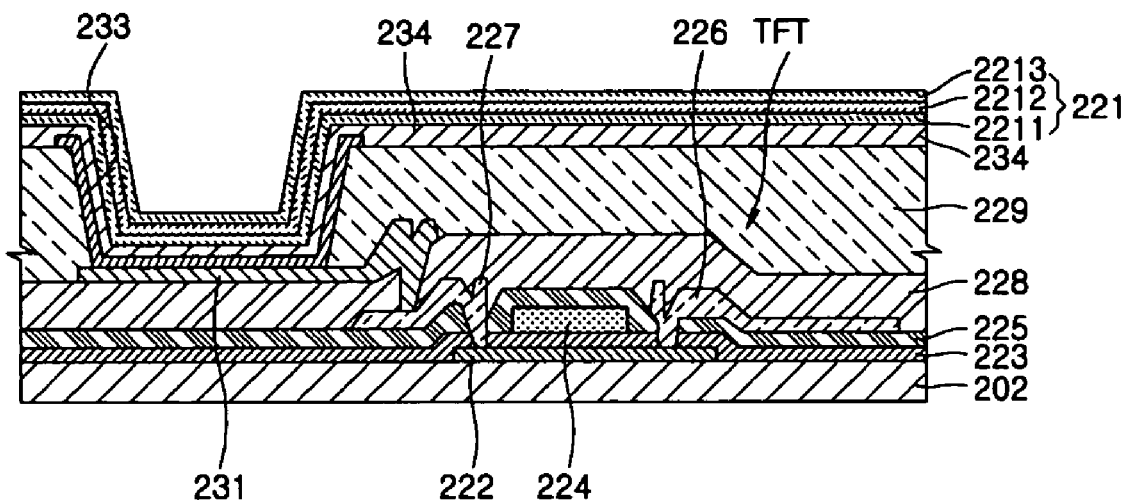
FIG. 5 is a schematic sectional view of an organic light emitting display according to another modified embodiment of the present invention.

FIG. 5 is a schematic sectional view of an organic light emitting display according to another embodiment of the present invention.

Referring to FIG. 5, the organic light emitting display includes a plurality of pixels formed on a substrate 202. Each of the pixels includes R/G/B subpixels that emit red light, green light, and blue light, respectively. The subpixel may include an EL device, and the EL device may include at least one TFT.

A light resonating layer may be formed on the subpixels. In one embodiment where each subpixel includes an EL device, a light resonating layer 221 is formed on a second electrode 234 of the EL device as illustrated in FIG. 5. In one embodiment, the thickness of the light resonating layer 221 varies depending on the wavelengths of light emitted from the subpixels. That is, the thickness of the light resonating layer 221 may be adjusted to maximize the external light coupling efficiency of light emitted from each subpixel.

Unlike the embodiment illustrated in FIG. 1, the light resonating layer 221 includes three or more layers 2211, 2212 and 2213, not two or more layers. At this time, the light resonating layer 221 may include high refractive layers and low refractive layers alternating with the high refractive layers. When the light resonating layer 221 includes three layers 2211, 2212 and 2213, the lowest layer 2211 and the highest layer 2213 may be lower in refractive index than the layer 2212 interposed therebetween.

Like the embodiment illustrated in FIG. 1, the low refractive layer 2211 and the high refractive layer 2212 function to focus horizontally-diffusing light on the front side of the organic light emitting display. In addition, the low refractive layer 2213 is disposed on the high refractive layer 2212 such that light resonance occurs in the high refractive layer 2212, thereby improving the external brightness. In one embodiment, the refractive index difference between the low refractive layer and the high refractive layer increases so as to facilitate the light resonance. Accordingly, when such a material is difficult to use, the same effect can be obtained by providing the resonating layer with a multi-layer structure including three or more layers.

Figure 6:
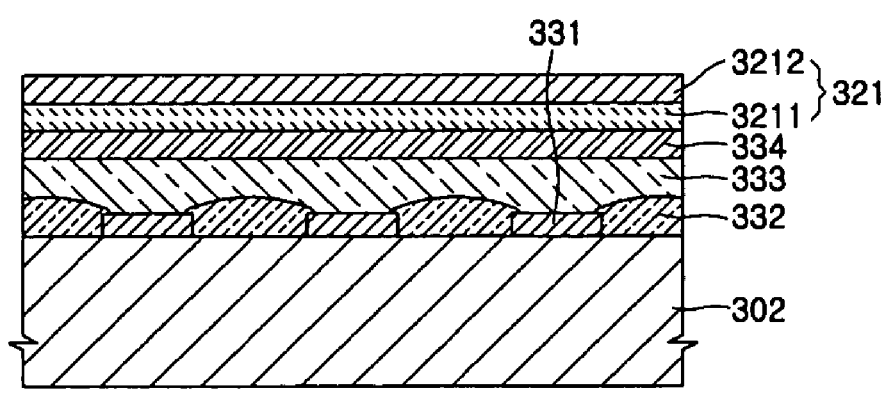
FIG. 6 is a schematic sectional view of an organic light emitting display according to another embodiment of the present invention.

FIG. 6 is a schematic sectional view of an organic light emitting display according to another embodiment of the present invention.

Referring to FIG. 6, the organic light emitting display includes a plurality of pixels formed on a substrate 302. Each of the pixels includes R/G/B subpixels that emit red light, green light, and blue light, respectively. The subpixel may include a passive matrix EL device.

A light resonating layer may be formed on the subpixels. In one embodiment where each subpixel includes a passive matrix EL device, a light resonating layer 321 is formed on a second electrode 334 of the passive matrix EL device as illustrated in FIG. 6. In one embodiment, the thickness of the light resonating layer 321 varies depending on the wavelengths of light emitted from the subpixels to maximize the external light coupling efficiency of light emitted from each subpixel.

Unlike the embodiment illustrated in FIG. 1, the organic light emitting display is a passive matrix organic light emitting display. That is, while the organic light emitting display of FIG. 1 includes at least one TFT provided to each EL device and adjusts the light emission of each subpixel using each TFT, the passive matrix organic light emitting display adjusts the light emission of each subpixel using the second electrode 334 and a first electrode 331 formed in a predetermined pattern, for example, a stripe pattern.

The structure of the passive matrix EL device according to one embodiment will now be described in brief with reference to FIG. 16.

Referring to FIG. 6, the first electrode 331 is formed in a predetermined pattern (e.g., a stripe pattern) on the substrate 302. An intermediate layer 333 including an emission layer and the second electrode 334 may be sequentially formed on the first electrode 331. An insulating layer 332 may be further provided between lines of the first electrode 331, and the second electrode 334 may be formed in a pattern perpendicular to that of the first electrode 331. Although not illustrated in FIG. 6, for the pattern of the second electrode 334, a separate insulating layer may be additionally formed in a pattern perpendicular to that of the first electrode 331. In one embodiment, the first electrode 331, the second electrode 34, and the intermediate layer 333 have the same structures and materials as described above.

The light resonating layer 321 includes two or more layers 3211 and 3212, and its thickness varies depending on the wavelength of light emitted from the subpixel (i.e., the emission layer). The light resonating layer 321 may include high refractive layers and low refractive layer alternating with the high refractive layer. In one embodiment, the light resonating layer 321 includes two layers, that is, a first layer (i.e., the layer 3211) and a second layer (i.e., the layer 3212).

In the above structure, the first layer 3211, which is closer to the subpixel (specifically, the second electrode 334) than the second layer 3212, is lower in refractive index than the second layer 3212, as described in the FIG. 1 embodiment. Accordingly, when the thickness t1 of the first layer 3211 and the thickness t2 of the second layer 3212 are adjusted to satisfy Equations 3 and 5, the brightness and the external light coupling efficiency of light emitted from the emission layer can be improved.

Figure 7:
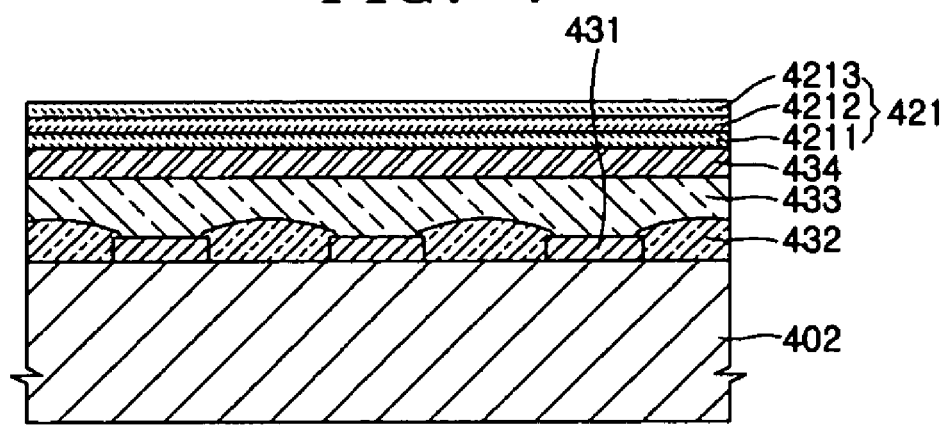
FIG. 7 is a schematic sectional view of an organic light emitting display according to another embodiment of the present invention.

FIG. 7 is a schematic sectional view of an organic light emitting display according to another embodiment of the present invention.

Unlike the embodiment illustrated in FIG. 6, the light resonating layer 421 includes three or more layers 4211, 4212 and 4213, not two or more layers. At this time, the light resonating layer 421 may include high refractive layers and low refractive layers alternating with the high refractive layers. When the light resonating layer 421 includes three layers 4211, 4212 and 4213, the lowest layer 4211 and the highest layer 4213 may be lower in refractive index than the layer 4212 interposed therebetween. It is apparent that the light resonating layer 421 may include more layers, the effect of which is the same as that of the FIG. 5 embodiment.

When one low refractive layer and one high refractive layer are provided to the light resonating layer, their thicknesses are adjusted to satisfy Equations 3 and 5. In this case, the light resonating layer may be formed in a structure illustrated in FIG. 8, in order to reduce the manufacturing process and cost and enhance the manufacturing an organic light emitting display.

Figure 8:
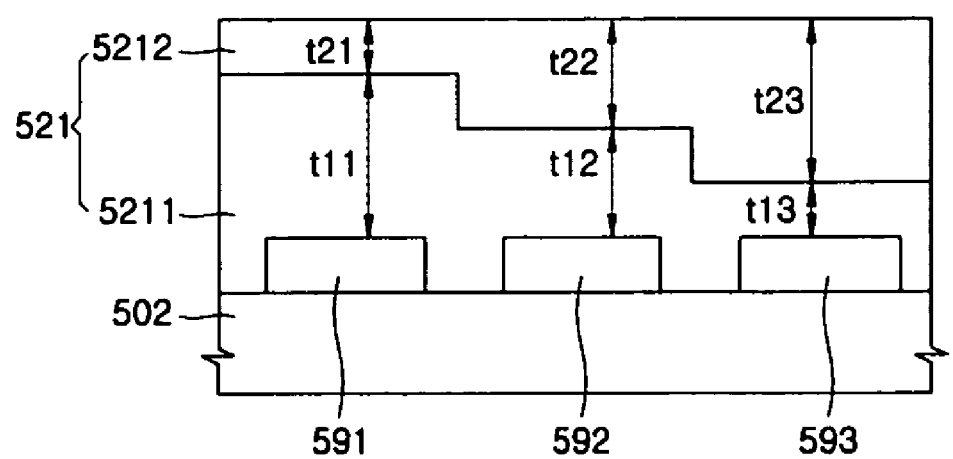
FIG. 8 is a schematic sectional view of an organic light emitting display according to another embodiment of the present invention.

Referring to FIG. 8, a first layer 5211 is formed on subpixels 591, 592 and 593 to cover the entire surface of a substrate 502. Thereafter, for example, a dry etching process is performed to form step differences in the first layer 521 such that the first layer 521 has thicknesses t11, t12 and t13 suitable for the wavelengths of light emitted from subpixels 591, 592 and 593. Thereafter, a second layer 5212 is coated on the resulting upper surface of the first layer 5212 to planarize the upper surface of the first layer 5212, thereby manufacturing a light resonating layer that is optimized according to the wavelengths of light emitted from the respective pixels. In this case, the thicknesses t21, t22 and t23 of the second layer 5212 with respect to the respective subpixels may also be adjusted differently. At this time, the thicknesses of the layers 5211 and 5212 in the light resonating layer 521 are determined depending on Equations 3 and 5. Since the positive integers n and m in Equations 3 and 5 are arbitrary positive integers, they can be adjusted to optimize the thicknesses of the layers 5211 and 5212. Although not illustrated in FIG. 8, the upper surface of the second layer 5212 may be etched by various methods, for example, dry etching, to adjust the thickness of the second layer 5212 more accurately.

In addition, the processes of forming the first and second layers may be repeated two or more times to manufacture the flat panel display having the light resonating layer with three or more layers.

Although each subpixel is implemented using the EL device in the above embodiments, the present invention is not limited to this structure. That is, the present invention can be applied to any light-emissive flat panel displays.

As described above, the flat panel display and the manufacturing method thereof according to embodiments of the present invention have the following advantages.

First, the light resonating layer with a plurality of layers is formed in the traveling path of light emitted from the respective subpixels, and the thicknesses of the layers in the light resonating layer are adjusted according to the wavelengths of the light emitted from the respective pixels. Consequently, it is possible to improve the brightness and the external light coupling efficiency.

Also, it is possible to easily manufacture the light resonating layer with the structure in which the low refractive layers alternate with the high refractive layers.

Also, it is possible to simplify the manufacturing process for the light resonating layer with a plurality of layers, by using the method in which a layer is formed and etched to have suitable step differences and another layer is formed on the etched layer.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A flat panel display, comprising:
   a substrate;
   a plurality of pixels formed on the substrate, wherein each pixel includes three subpixels emitting red light, green light, and blue light, respectively; and
   a light resonating layer formed on the subpixels,
   wherein the light resonating layer includes a plurality of sub-layers, wherein each of the sub-layers comprises, in a given pixel, three sections having different thicknesses, and wherein the three sections are formed over the three subpixels, respectively.

2. The flat panel display of claim 1, wherein the light resonating layer includes at least one low refractive layers and at least one high refractive layers, wherein the at least one low refractive layers has a first refractive index, and wherein the at least one high refractive layer has a second refractive index which is greater than the first refractive index.

3. The flat panel display of claim 1, wherein the light resonating layer includes a first sub-layer and a second sub-layer.

4. The flat panel display of claim 3, wherein the first sub-layer is closer to the subpixel than the second sub-layer and has a lower refractive index than that of the second sub-layer.

5. The flat panel display of claim 4, wherein the refractive index of the first sub-layer is in the range of about 1.0 to about 1.5.

6. The flat panel display of claim 5, wherein the first sub-layer is formed of at least one of the following: silicate matrix, methylsiloxanes polymer, siloxane, Ti—O—Si, acrylic polymer, epoxy polymer, an oxide, and a fluoride.

7. The flat panel display of claim 4, wherein the refractive index of the second sub-layer is in the range of about 1.5 to about 3.0.

8. The flat panel display of claim 7, wherein the second sub-layer is formed of a sol gel material.

9. The flat panel display of claim 8, wherein the high refractive particles are formed of at least one of the following: $SiN_x$, $TiO_2$, $Nb_2O_5$, and $Ta_2O_x$.

10. The flat panel display of claim 4, wherein the thickness of the first sub-layer is $(n\lambda)/2$, where n is a positive integer and $\lambda$ is the wavelength of light emitted from the subpixel.

11. The flat panel display of claim 4, wherein the thickness of the second sub-layer is $(2m+1)\lambda/4$, where m is a positive integer and $\lambda$ is the wavelength of light emitted from the subpixel.

12. The flat panel display of claim 1, wherein the subpixel comprises an organic light emitting device.

13. The flat panel display of claim 1, wherein the light emitted from the subpixels is emitted upward from the subpixels.

14. A flat panel display, comprising:
a substrate;
a plurality of pixels formed on the substrate, wherein each pixel includes a plurality of subpixels and each subpixel emits a different color of light; and
a brightness control layer formed on the subpixels, wherein the brightness control layer includes first and second sub-layers, wherein at least one of the first and second sub-layers comprises, in a given pixel, a plurality of sections having different thicknesses, and wherein the plurality of sections are formed over the plurality of subpixels, respectively.

15. The flat panel display of claim 14, wherein the first sub-layer has a first refractive index, and wherein the second sub-layer has a second refractive index which is greater than the first refractive index.

16. The flat panel display of claim 14, wherein the brightness control layer includes more than two sub-layers sequentially formed, and wherein two adjacent sub-layers have substantially different refractive indexes.

17. The flat panel display of claim 14, wherein the plurality of subpixels include three subpixels emitting red light, green light, and blue light, respectively.

* * * * *

UNITED STATES PATENT AND TRADEMARK OFFICE
CERTIFICATE OF CORRECTION

PATENT NO. : 7,598,671 B2  Page 1 of 1
APPLICATION NO. : 11/485796
DATED : October 6, 2009
INVENTOR(S) : Song et al.

It is certified that error appears in the above-identified patent and that said Letters Patent is hereby corrected as shown below:

| Column | Line | Description of Error |
|---|---|---|
| 5 | 41 | Change "(AlQ3)." to --($AlQ_3$).--. |
| 7 | 14 | Change "Equation according" to --Equation 5 according--. |
| 10 | 54 | In Claim 2, change "layers" to --layer--. |
| 10 | 55 | In Claim 2, change "layers" to --layer--. |
| 10 | 56 | In Claim 2, change "layers" to --layer--. |

Signed and Sealed this

Twenty-ninth Day of June, 2010

David J. Kappos
*Director of the United States Patent and Trademark Office*